United States Patent
Thurgate et al.

[11] Patent Number: 6,103,602
[45] Date of Patent: Aug. 15, 2000

[54] METHOD AND SYSTEM FOR PROVIDING A DRAIN SIDE POCKET IMPLANT

[75] Inventors: Timothy J. Thurgate, Sunnyvale; Vei-Han Chan, San Jose, both of Calif.

[73] Assignee: Advanced Micro Devices, Inc., Sunnyvale, Calif.

[21] Appl. No.: 08/992,618

[22] Filed: Dec. 17, 1997

[51] Int. Cl.[7] .................................. H01L 21/8238
[52] U.S. Cl. .................... 438/525; 438/262; 438/527; 438/528; 438/529
[58] Field of Search ........................ 438/525, 286, 438/527, 262, 263

[56] References Cited

U.S. PATENT DOCUMENTS

| | | | |
|---|---|---|---|
| 5,019,527 | 5/1991 | Oshima et al. ....................... | 438/257 |
| 5,147,811 | 9/1992 | Sakagami ............................. | 438/257 |
| 5,258,095 | 11/1993 | Nagata et al. ........................ | 216/67 |
| 5,286,665 | 2/1994 | Muragishi et al. .................... | 438/257 |
| 5,427,963 | 6/1995 | Richart et al. ....................... | 438/257 |
| 5,510,279 | 4/1996 | Chien et al. .......................... | 438/302 |
| 5,512,503 | 4/1996 | Hong ..................................... | 438/266 |
| 5,518,942 | 5/1996 | Shrivastava ........................... | 438/525 |
| 5,744,371 | 4/1998 | Kadosh et al. ........................ | 438/286 |
| 5,830,788 | 11/1998 | Hiroki et al. ......................... | 438/199 |
| 5,893,739 | 4/1999 | Kadosh et al. ........................ | 438/286 |
| 5,903,029 | 5/1999 | Hayashika et al. .................... | 257/344 |

OTHER PUBLICATIONS

S. Wolf, Silicon Processing for the VLSI Era, vol. 1, Lattice Press, pp. 303–308, 1986.
S. Wolf, Silicon Processing for the VLSI Era, vol. 2, Lattice Press, pp. 589–591, 1990.

*Primary Examiner*—Donald L. Monin, Jr.
*Assistant Examiner*—Hoai Pham
*Attorney, Agent, or Firm*—Sawyer & Associates

[57] ABSTRACT

A system and method for providing a memory cell on a semiconductor is disclosed. The memory cell has a source and a drain. The method and system include providing a source implant in the semiconductor, providing a pocket implant in the semiconductor, and providing a drain implant in the semiconductor after the pocket implant is provided. Thus, short channel effects are reduced.

6 Claims, 4 Drawing Sheets

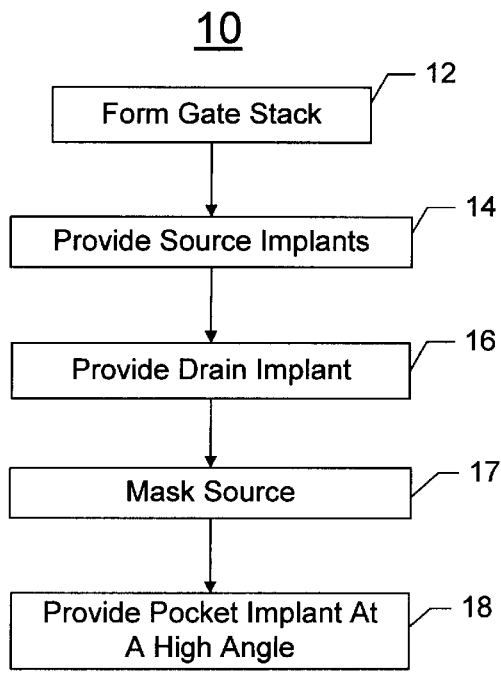
Prior Art
Figure 2
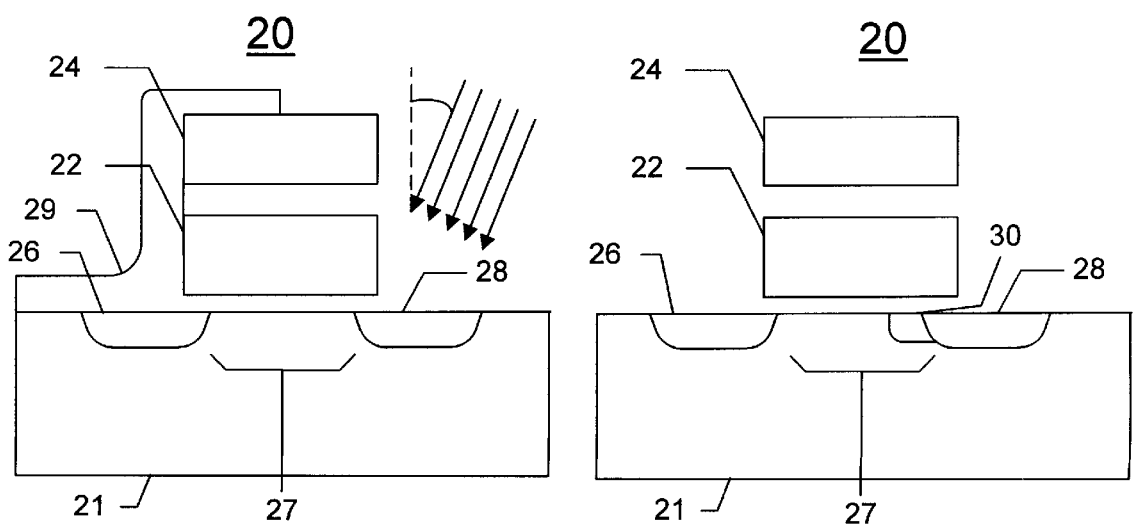
Prior Art
Figure 3A
Prior Art
Figure 3B

100

METHOD AND SYSTEM FOR PROVIDING A DRAIN SIDE POCKET IMPLANT

FIELD OF THE INVENTION

The present invention relates to flash memory cells and more particularly to a method and system for providing a pocket implant near a drain of the flash memory cell. The pocket implant reduces short channel effects without increasing substrate current during erase and may not require an additional mask or a high angled implant.

BACKGROUND OF THE INVENTION

In nonvolatile memories, such as flash memory, it is desirable to shrink the size of a conventional memory cell. A conventional memory cell typically includes a gate stack, a source, a drain, and a channel disposed between the source and drain. The gate stack typically includes at least a floating gate and a control gate. Shrinking the size of conventional memory cells allows a higher density of memory cells to be provided in a given area of the semiconductor. However, shrinking the size of the conventional memory cell can adversely affect the performance of the conventional memory cell.

For example, as the size of the conventional memory cell decreases, the length of the channel decreases. This decrease in the length of the channel results in short channel effects which adversely affect the performance of the memory cell. One short channel effect is called drain induced barrier lowering ("DIBL"). DIBL can cause variations in the threshold voltage with drain voltage. As the threshold voltage lowers, the memory cell can be erroneously turned on, decreasing the reliability of the memory cell.

A conventional method for reducing such short channel effects proposes increasing the channel dopant. Increasing the channel dopant increases the threshold voltage at shorter channels. However, an increase in the dopant near the source of the device can cause the electric field between the source and the underlying semiconductor to increase. This increased electric field can adversely affect the performance of the memory cell, particularly during erase.

During a conventional erase, a high negative bias is applied to the gate stack and a high positive bias is applied to the source. This allows charge carriers to tunnel between the floating gate and the source. Because of the concentration of channel dopant near the source, a high electric field is also generated between the substrate and the source. This high electric field causes band-to-band tunneling, causing a substrate current to flow between the substrate and the source. This substrate current can be much larger than the expected erase current. As a result, a voltage drop across the memory cell is generated. Because the sources of many memory cells are coupled to the same line, the bias applied to each memory cell can drop significantly along the line. As a result, a memory cell near the end of the line will be subjected to a lower voltage. Consequently, memory cells along the line are erased at different rates. Different erase rates along a single line are undesirable.

One conventional method that has been proposed for reducing the substrate current and increasing the threshold voltage is to use a non-uniform channel profile. The non-uniform channel profile would have a higher concentration of channel dopant near the drain than near the source. However, processing of such a memory cell would be more difficult because of the introduction of an additional mask to prevent channel dopant from reaching the area of the semiconductor near the source. In addition, such an implant typically uses a high angle implant. A high angle implant is used to place the channel dopant in front of the portion of the drain closest to the gate stack. The channel dopant is provided in this area because the implant in the drain, typically arsenic, may prevent the channel dopant from diffusing into the channel. Manufacturers typically implant at an angle of approximately seven degrees or less. Thus, in addition to requiring an extra mask, this conventional method cannot easily performed by manufacturers because of the high angle implant.

Accordingly, what is needed is a system and method for reducing short channel effects without significantly complicating processing. The present invention addresses such a need.

SUMMARY OF THE INVENTION

The present invention provides a method and system for providing a flash memory cell. The memory cell has a source and a drain. The method and system comprise providing a source implant, providing a pocket implant, and providing a drain implant after the pocket implant has been provided. Thus, short channel effects are reduced.

According to the system and method disclosed herein, the present invention short channel effects are reduced without requiring manufacturers to provide a high angle implant, thereby increasing overall system performance.

BRIEF DESCRIPTION OF THE DRAWINGS

FIG. 2 is a flow chart of a conventional method for providing a flash memory cell including a pocket implant.

FIG. 3A is a is a block diagram of a conventional flash memory cell during implanting of the pocket implant.

FIG. 3B is a block diagram of a conventional flash memory cell having a pocket implant.

DETAILED DESCRIPTION OF THE INVENTION

The present invention relates to an improvement in flash memory cells and processing. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
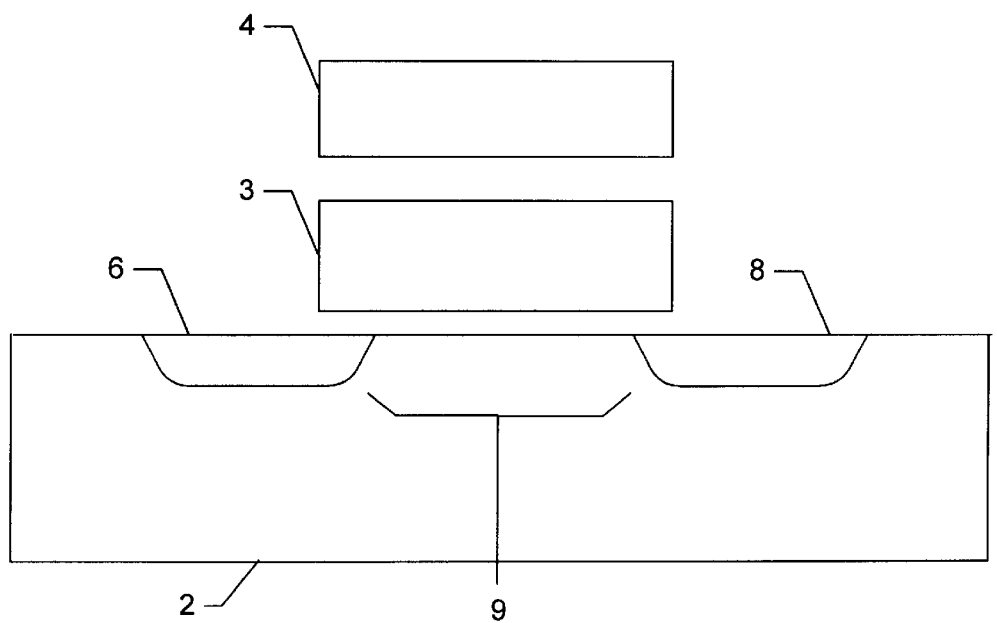
FIG. 1 is a block diagram of a conventional flash memory cell.

FIG. 1 is a block diagram of a conventional flash memory cell 1. The conventional memory cell 1 includes a source 6, a drain 8, and a gate stack including a floating gate 3 and a control gate 4. The conventional memory cell 1 also includes a channel 9 disposed between the source 6 and the drain 8.

Although the memory cell 1 functions at larger device sizes, one of ordinary skill in the art will realize that as the size of the memory cell 1 shrinks, the decreasing length of the channel 9 results in short channel effects. These short channel effects adversely affect the performance of the memory cell. For example, one short channel effect is drain induced barrier lowering ("DIBL"). DIBL can cause variations in the threshold voltage with drain voltage. As the threshold voltage lowers, the memory cell can be erroneously turned on, decreasing the reliability of the memory cell.

FIG. 2 depicts a conventional method 10 for providing a flash memory cell while attempting to reduce such short channel effects. The gate stack is first formed via step 12. The implants for the sources are then performed via step 14. Typically, the implant is a double diffuse implant including a phosphorus and an arsenic implant. The drain is then implanted via step 16. Steps 14 and 16 typically include both implant and an annealing steps to diffuse the source and drain implants, respectively. Typically, the dopant for the drain implant is arsenic. The source is then masked via step 17. A high angle pocket implant is typically then provided via step 18. During the high angle pocket implant performed in step 18, the source is typically masked. The dopant used during the high angle pocket implant step 18 is typically of the same type as the channel dopant. The high angle pocket implant step 18 may also include an annealing step to diffuse the dopant used in the pocket implant further into the underlying semiconductor.

FIG. 3A depicts a conventional flash memory cell 20 during the high angle pocket implant step 18. The gate stack formed via step 12 includes at least a floating gate 22 and a control gate 24. The source 26 and drain 28 have been formed during steps 14 and 16, respectively. The channel 27 is between the source 26 and the drain 28. The source 26 is masked by photoresist 29.

The source is masked by photoresist to ensure that little of the dopant provided by the high angle pocket implant step 18 reaches the portion of the channel 27 near the source 26. An increase in the channel dopant near the source 26 of the memory cell 20 could cause a high electric field between the source 26 and the underlying semiconductor 21 to increase. This increased electric field could cause a substrate current to flow between the substrate 21 and the source 26 during erase. This substrate current can be much larger than the expected erase current. As a result, a voltage drop across the memory cell 20 is generated. Because the sources of many memory cells are coupled to the same line, the bias applied to each memory cell can drop significantly along the line. As a result, a memory cell near the end of the line will be subjected to a lower voltage. Consequently, memory cells along the line are erased at different rates. Different erase rates along a single line are undesirable. In order to avoid this undesirable result, the source 26 is masked by the photoresist 29 during the high angle pocket implant step 28.

The high angle pocket implant step 18 is provided at a high angle to ensure that the dopant used in the high angle pocket implant step 18 reaches a portion of the channel 27 in front of the drain. The high angle pocket implant dopant is provided in this area because the implant in the drain 28, typically arsenic, may otherwise prevent the dopant used for the pocket implant from diffusing into the channel 27.

FIG. 3B depicts the memory cell 20 after the high angle pocket implant step 18 has been completed and the photoresist 29 has been stripped. The memory cell 20 includes the pocket implant 30. The pocket implant 30 aids in reducing short channel effects, but does not reach the portion of the channel 27 near the source 26. The pocket implant 30 is also at the front of the drain 28 because the pocket implant 30 was provided at a high angle. Thus, the dopant in the drain 28 could not prevent the dopant used for the pocket implant 30 from diffusing into the channel 27.

Although the conventional memory cell 20 may have fewer short channel effects, one of ordinary skill in the art will realize that the method 10 is made more complex because of the inclusion of the source masking step 17. One of ordinary skill in the art will also realize the high angle pocket implant step 18 is difficult for manufacturers to perform. Manufacturers typically implant at an angle of approximately seven degrees or less. Thus, in addition to requiring an extra mask, the conventional method 10 cannot easily performed by manufacturers because of the high angle pocket implant.

The present invention provides for a method and system for reducing short channel effects without significantly complicating processing. The method and system provide a flash memory cell having a source and a drain. To provide the flash memory cell, a source implant is first provided. A pocket implant is also provided. After the pocket implant is provided, a drain implant is provided.

The present invention will be described in terms of a particular dopant used for the pocket implant for a single flash memory cell. However, one of ordinary skill in the art will readily recognize that this method and system will operate effectively for other types of nonvolatile technology, other dopants, and for providing numerous flash memory cells in a single process.

Figure 4:
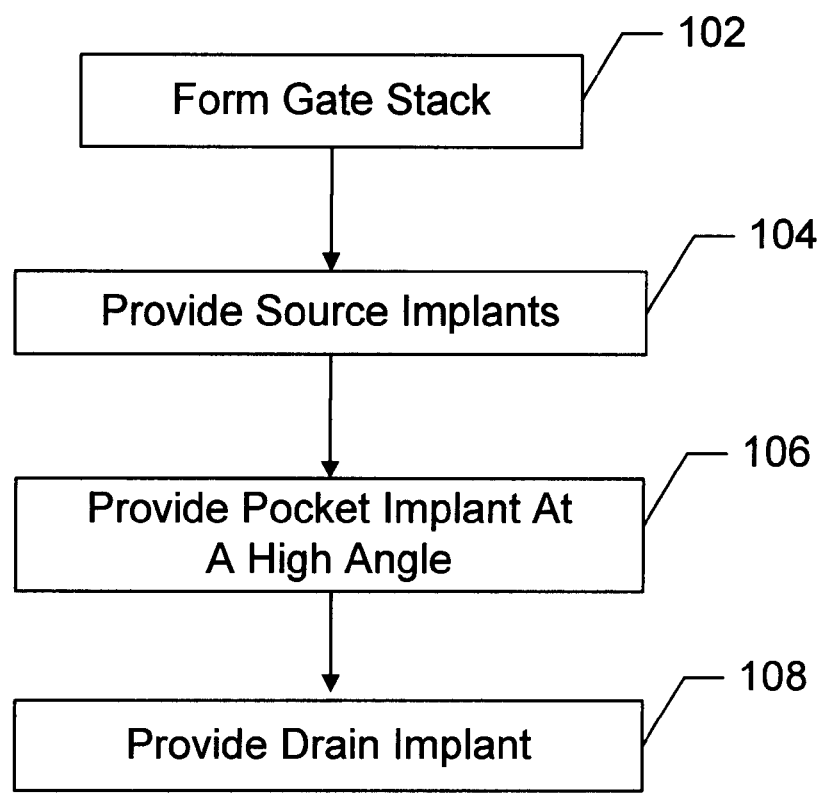
FIG. 4 is a flow chart depicting a method for providing a flash memory cell in accordance with the present invention.

To more particularly illustrate the method and system in accordance with the present invention, refer now to FIG. 4 depicting a flow chart of one embodiment of a method 100 in accordance with the present invention. A gate stack is formed via step 102. A source implant is then provided via step 104. Thus, in one embodiment, the source is self-aligned. In a preferred embodiment, the source implant in step 104 is a double diffuse implant including a phosphorus implant and an arsenic implant. A pocket implant is then provided via step 104. The pocket implant is preferably of the same type as a channel dopant, not shown. The pocket implant need not be provided at high angle because no drain implant has been provided. In a preferred embodiment, the dopant used to provide the pocket implant is boron. Also in a preferred embodiment, the pocket implant providing step 104 includes an annealing step to drive the pocket implant into an underlying semiconductor. A drain implant is then provided via step 108.

Figure 5A:
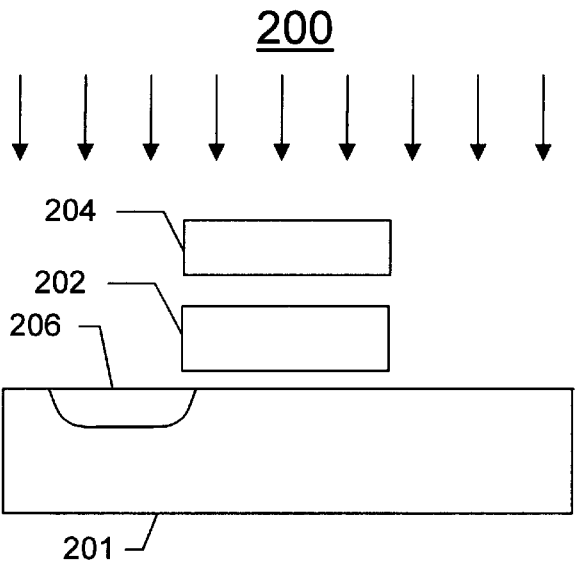
FIG. 5A is a block diagram of a memory cell in accordance with the present invention during implanting of the pocket implant.

FIG. 5A depicts a flash memory cell 200 in accordance with the present invention during the pocket implant providing step 104. The memory cell 200 already includes a gate stack having at least a floating gate 202 and a control gate 204. The source 206 has also been provided. The pocket implant direction, shown by the arrows, is substantially perpendicular to the surface of an underlying semiconductor 201. In a preferred embodiment, the pocket implant direction is within approximately seven degrees of perpendicular to the surface of the semiconductor 201. Because the pocket implant is provided at a direction substantially perpendicular to the surface of the semiconductor 201, manufacturing is simpler. Moreover, no source mask may be required prior to providing the pocket implant, further simplifying processing.

Figure 5B:
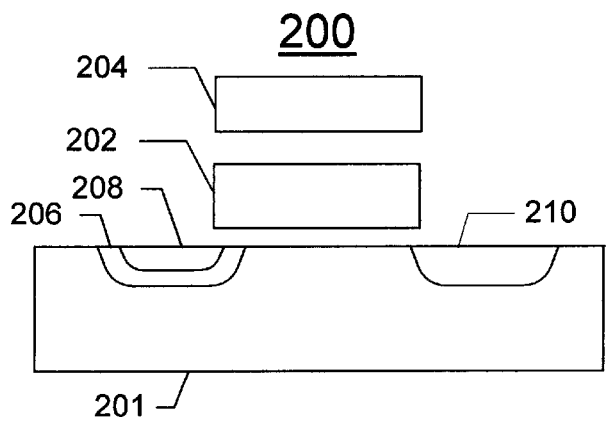
FIG. 5B is a block diagram of a memory cell in accordance with the present invention after implanting and annealing of the pocket implant.

FIG. 5B depicts the memory cell after the pocket implant step 104, including a step used to diffuse the pocket implant into the semiconductor 201, has been performed. A source side pocket implant 208 and a drain side pocket implant 210 have been provided.

Figure 5C:
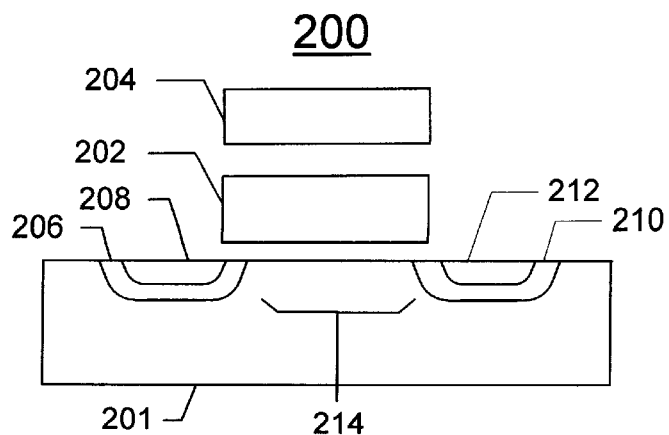
FIG. 5C is a block diagram of a memory cell in accordance with the present invention.

FIG. 5C depicts the memory cell 200 after a drain 212 has been provided. Because of the interaction between the dopant in the source side pocket implant 208 and the source 206, the source side pocket implant does not diffuse through to the underlying semiconductor 201. Consequently, no high electric field and no substrate current due to the source side pocket implant 208 should be generated during erase. In addition, because the drain side pocket implant 210 was provided prior to the drain 212, the drain side pocket implant 210 resides in the channel 214 between the source 206 and the drain 212. Thus, short channel effects are also reduced.

Because the pocket implants 208 and 210 were provided prior to the drain 206, a high angle pocket implant was not required to place the drain side pocket implant 210 in the appropriate location. In a preferred embodiment, a source side mask is not necessary. However, even if a source side mask is used, for example to prevent the diffusion of a source dopant from being larger than desired, a high angle pocket implant is still unnecessary. Thus, short channel effects are reduced while manufacturing is simplified.

A method and system has been disclosed for providing a flash memory cell having reduced short channel effects without substantially increasing processing complexity.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for providing a memory cell on a semiconductor having a surface, the memory cell having a source, a drain, and a gate stack, the method comprising the sequential steps of:

(a) providing a source implant of a first conductivity type in the semiconductor in a source side of the gate stack;

(b) providing a pocket implant of a second conductivity type in the semiconductor in the source side of the gate stack and a drain side of the gate stack, the drain side of the gate stack being opposite to the source side of the gate stack, the pocket implant being in a direction substantially perpendicular to the surface of the semiconductor and within seven degrees of perpendicular to the surface of the semiconductor, the second conductivity type being opposite in charge polarity to the first conductivity type; and (c) providing a drain implant of the first conductivity type in the semiconductor in the drain side of the gate stack, wherein short channel effects are reduced.

2. The method of claim 1 wherein the pocket implant providing step (b) further includes the step of:

(b2) annealing the pocket implant.

3. The method of claim 1 further comprising the step of:

(d) providing a gate stack on the semiconductor.

4. The method of claim 3 wherein the pocket implant providing step (b) further includes the step of:

(b2) providing a pocket implant of boron.

5. The method of claim 4 wherein the source implant providing step (b) further includes the step of:

(b3) providing a source implant of arsenic, wherein the arsenic implant retards a portion of the boron pocket implant residing in the source from diffusing.

6. The method of claim 5 wherein the source implant providing step (b) further includes the step of:

(b4) providing a self aligned source implant.

\* \* \* \* \*